United States Patent
Tost et al.

(10) Patent No.: US 11,536,769 B2
(45) Date of Patent: Dec. 27, 2022

(54) METHOD FOR OPERATING A TEST SYSTEM AND OPERATION ASSISTANCE APPARATUS

(71) Applicant: Rohde & Schwarz GmbH & Co. KG, Munich (DE)

(72) Inventors: Johann Tost, Munich (DE); Andrea Limmer, Finsing (DE); Chin Haur Ng, Singapore (SG)

(73) Assignee: Rohde & Schwarz GmbH & Co. KG, Munich (DE)

(*) Notice: Subject to any disclaimer, the term of this patent is extended or adjusted under 35 U.S.C. 154(b) by 517 days.

(21) Appl. No.: 16/369,706

(22) Filed: Mar. 29, 2019

(65) Prior Publication Data

US 2020/0309854 A1    Oct. 1, 2020

(51) Int. Cl.
*G01R 31/317*    (2006.01)

(52) U.S. Cl.
CPC .............. *G01R 31/31724* (2013.01)

(58) Field of Classification Search
CPC ............... G01R 31/31724; G01R 31/31908
See application file for complete search history.

(56) References Cited

U.S. PATENT DOCUMENTS

| | | | | |
|---|---|---|---|---|
| 3,869,811 | A * | 3/1975 | Valentine | G09B 23/183 434/314 |
| 4,192,451 | A * | 3/1980 | Swerling | G06F 11/261 714/28 |
| 4,207,611 | A * | 6/1980 | Gordon | G01R 31/007 701/33.9 |
| 10,109,111 | B2 | 10/2018 | Sterzbach | |
| 2006/0273807 | A1* | 12/2006 | Okawa | G01R 31/2621 324/713 |
| 2014/0375957 | A1* | 12/2014 | Apperson | G03B 21/32 353/28 |
| 2016/0231354 | A1* | 8/2016 | Rayman | G01R 31/2844 |
| 2017/0132840 | A1* | 5/2017 | Sterzbach | H04N 13/204 |
| 2018/0180293 | A1* | 6/2018 | Holzinger | G06F 3/0416 |
| 2019/0376999 | A1* | 12/2019 | Gervedink Nijhuis | G01R 13/029 |

FOREIGN PATENT DOCUMENTS

EP    3165979 A1    5/2017

* cited by examiner

*Primary Examiner* — Michael J Dalbo
(74) *Attorney, Agent, or Firm* — Westman, Champlin & Koehler, P.A.

(57) ABSTRACT

The present invention relates a method and apparatus for setting a test configuration. A test device for testing a device under test is identified, and the measurement interfaces of the test device are assigned to appropriate measurement points of the device under test. The configuration of the test scenario is established by generating a representation of the test device and the connections between the interface of the test device and the related measurement points.

18 Claims, 2 Drawing Sheets

METHOD FOR OPERATING A TEST SYSTEM AND OPERATION ASSISTANCE APPARATUS

TECHNICAL FIELD

The present invention relates to a method for operating a test system. The present invention further relates to an operation assistance apparatus.

BACKGROUND

Although applicable in principle to any test system, the present invention and its underlying problem will be hereinafter described in connection with the operation of an oscilloscope.

Testing modern devices, for example modern communication devices, requires a more and more complex test scenario. For establishing such test scenario, a number of one or more test devices have to be connected to multiple measurement points of the device under test.

For example, an oscilloscope may measure multiple channels in parallel. For performing a specific test, the multiple channels have to be connected to multiple predetermined measuring points of a device under test.

Due to the high number of measurement points, the preparation of the test arrangement becomes complex and difficult. Thus, the risk of a failure in the test configuration may increase.

Against this background, there is a need for an improved guidance of a user when establishing a test arrangement. In particular, there is a need for an automated guidance of a user for preparing a test arrangement and operating the test devices during a test.

SUMMARY

The present invention solves this problem by a method for operating a test system and an operation assistance apparatus with the features of the independent claims. Further advantageous embodiments are subject matter of the dependent claims.

According to a first aspect, a method for operating a test system for testing a device under test is provided. The method comprises a step of identifying a test device. Thee test device may be configured to perform at least one test operation for testing the device under test. The method further comprises a step of assigning at least on measurement point of the device under test to an interface of the identified test device. The interface may be configured to receive a test the signal from the device under test. Additionally or alternatively, the interface may be configured to provide a test the signal to the device under test. The method further comprises a step of generating a dynamic representation of a test configuration. The generated dynamic representation is generated based on the identified test device and the assignment of the measurement points and the corresponding interfaces of the test device.

According to a further aspect, an operation assistance apparatus is provided. The apparatus comprises at least an interface and a processor. The interface is configured to establish a connection of the operation assistance apparatus with a test device. The test device may be configured to perform at least one test operation for testing a device under test. The processor is configured to identify the test device connected to the operation assistance apparatus. The processor is further configured to assign at least on measurement point of the device under test to an interface of the identified test device. The processor is further configured to generate a dynamic representation of a test configuration. The generated dynamic representation is generated based on the identified test device and the assignment of the assigned measurement points and the corresponding interfaces of the test device.

The present invention is based on the fact that assisting a user by a visual representation during a test may help the user understanding the test scenario and establishing a desired test configuration. Due to the high complexity of required test arrangements, it becomes more and more difficult to establish appropriate connections between the measurement points of a device under test and the corresponding connection terminals of a test device e.g. an oscilloscope or a signal generator. Due to continuous development of test devices and devices under test, the appearance of the test devices and the devices under test may change over time. Thus, providing only a prestored static image of a test scenario may be not appropriate for assisting a user in continuously changing environment.

The present invention therefore takes into account these facts and aims to provide an improved assistance of a user when testing a device under test. In particular, the present invention aims to provide a representation of a test configuration which is dynamically adapted. For example, a related test device, e.g. an oscilloscope or the signal generator, may be automatically identified and taken into account when assisting the user. In this way, a representation of a desired test scenario may be dynamically adapted to the related test device or even multiple related test devices. In this way, the user is always provided with an appropriate representation which relates to the desired test configuration. In particular, the provided representation may change if the related test device changes.

For identifying one or more related test devices, the test device may be identified by any appropriate manner. For example, a wired or wireless communication link may be established with the related test device, and the test device may be identified by receiving appropriate data, for example an identifier or the like, from the test device. For this purpose, an appropriate interface, in particular a wired or wireless communication interface may be provided in an operation assistance apparatus. The interface may be used for communicatively coupling the operation assistance apparatus and the test device.

Furthermore, it may be possible to acquire an image of a related test device, for example, by a camera, and the acquired image may be used to identify the respective test device by means of optical recognition or the like. However, any other appropriate method for identifying one or more related test devices may be also possible.

The test device may be any kind of test device for testing a device under test. For example, the test device may measure one or more signal of a device under test. The measured signals may be, for example, electric signals such as a voltage, a current or the like. The measured signals may be direct current (DC) signals, alternating current (AC) signals, especially radio frequency (RF) signals. The test device may measure any number of one or more test signals in parallel. For this purpose, the test device may have an appropriate number of interfaces, terminals or connectors for receiving the measurement signals. For example, a separate connector may be provided for each measurement signal. In particular, each interface for receiving a measurement signal may be related to a specific channel of the test device.

Furthermore, it may be also possible that the test device may generate test signals and provide the generated test signals to the device under test. For this purpose, a number of one or more output interfaces may be provided. The test signals may be any kind of appropriate test signals, for example DC, AC or RF signals. The test signals may be generated by any kind of appropriate test signal generator. Such a test signal generator may be any kind of analog or digital device for generating the desired test signals. Each test signal which is provided to the device under test may be associated to a specific channel of the test device.

For measuring the signals of the device under test and/or providing test signals to the device under test, an appropriate configuration is applied to the test device. Such a configuration may be, for example, a pre-stored setting. The pre-stored setting may be stored, for example, in a configuration memory of the test device. The stored configuration may be read from the memory and applied to the test device for setting the test apparatus accordingly. Additionally or alternatively, a user may enter desired specifications for configuring the test device, or appropriate settings may be provided to the test device by an analog or digital interface from an external device.

A configuration of the test device may be applied, for example, by a control device. In particular, the control device may determine one or more properties of the configuration of the test device. The control device may set the properties, for example, by reading a current configuration from a memory and configuring the test device accordingly. Additionally or alternatively, the configuration may be also set by receiving the desired settings entered by a user and/or received by an external interface. However, it is understood that any other manner for setting the configuration of the test device may be also possible. In particular, the generated representation may also provide information to a user for configuring or setting the test device according to a desired test scenario.

Each input and/or output interface of the test device may relate to a specific channel. The processor may determine, for each interface of the test device, a corresponding test point or measurement point of the device under test. The processor may also determine a related signal or signal type of a signal provided on the respective terminal. The related measurement point and/or signal type of an interface may be determined, for example, based on a desired test for testing the device under test. In particular, the determination of the related measurement points and the assignment to a specific interface of the test device may be performed based on the identified test device. For example, if an oscilloscope with a number of available channels is identified, for a device having example 8 input channels, it may be possible to assign the respective number of channels to related measurement points of the device under test. Furthermore, it may be possible to take into account the type of the measurement device and/or a currently set configuration of the measurement device.

The identification of the test device, the assignment of the interfaces to the measurement points and/or the generation of the dynamic representation may be performed by a processor comprising a number of one or more processing devices. Each processing device may comprise a processing unit and a memory for storing instructions which cause the processing unit to execute the desired operations.

Further embodiments of the present invention are subject of further subclaims and the following description referring to the drawings.

In a possible embodiment, the identifying of the test device comprises identifying a type of the test device and/or a configuration of the test device.

In particular, the identification of the test device may comprise identifying the number of available input and/or output interfaces, determining a specific type of test device, e.g. by receiving an appropriate identification from the test device, or the like. The identification of the test device may also determine a current configuration or setting of the identified test device. For example, a number of activated channels may be determined, measurement parameters such as sampling rate, resolution, etc. may be determined, or any other appropriate configuration parameter may be determined.

In a possible embodiment, the generated dynamic representation of the test configuration comprises a first section and a second section, the first section is dynamically generated based on the identified test device. Additionally or alternatively, the second section is dynamically generated based on the assignment of the measurement points and the corresponding interfaces of the test device.

Accordingly, the representation of the test configuration is separated into two sections, wherein the first section relates to the test device and the second section relates to the assignment of the test device to the device under test. In this way, a user can easily grasp the overall configuration. By separating the whole representation of the test scenario into a first section relating to the test device and a second section relating to the connection properties, the representation can be generated in a very easy manner. In particular, the first section only has to be altered when detecting a change in the configuration of the test device, and the second section only has to be altered when detecting a change in the properties in the connection between the test device and the device under test.

In a possible embodiment, the first section comprises a dynamically generated representation of a front plate of the identified test device.

The representation of the front plate may comprise, for example, representations of the operating elements and/or the indicators representing the setting of the test device. For example, the representation of the front plate may be a representation of a front plate of an oscilloscope, a spectrum analyzer, a signal generator, a power meter or any other appropriate test device. In this way, the representation of the front plate also may represent the configuration of the whole test device. Furthermore, the representation of the front plate may also represent an illustration of the measurement results. In this way, the representation of the first section may even be a copy, at least a schematic copy of the test device. In this way, a user can recognize all relevant information of the test device based on the first section of the representation. Furthermore, the user can be easily guided through the process for establishing the desired connections between the test device and the device under test. Additionally, it may be also possible to assist a user for operating the test device in order to achieve a desired setting or configuration.

In a possible embodiment, the second section comprises a representation including at least one of a representation of a measurement interface label, measurement setup information, connection information between the interface of the test device and the assigned measurement points of the device under test, information of an expected signal, in particular an expected waveform, or a representation of a button or key of the identified test device.

In this way, the second section of the dynamically generated representation relates to properties in connection with the associated device under test. Hence, for generating the second section of the dynamically generated representation, it is necessary to consider the information of the associated device under test, while the first section of the representation can be generated without considering such information. Furthermore, for evaluating the representation and the test scenario, a user may focus on the second section in order to get all relevant information in association with the device under test.

In a possible embodiment, the method further comprises a step of determining a test procedure for testing the device under test. The determined test procedure may specify a number of related measurement points at the device under test and/or a type of each related measurement point.

The respective test procedure may be stored, for example, in an appropriate memory. Alternatively, the test procedure may be provided from an external device, for example, via an interface or the like. The test procedure may be a specific procedure which has to be executed for testing the device under test. For example, the test procedure may comprise a sequence of test signals which have to be applied to the device under test in a predetermined order. In particular, the test signals may be provided to predetermined test points of the device under test. Furthermore, the test procedure may specify characteristics of measurement signals which may be expected during the test procedure. The characteristics of the measured signals at specific measurement points may relate to voltage levels, specific pulse sequences, frequencies or frequency ranges, etc. However, any other kind of test configuration may be also specified. Further to measurement signals which may be expected during a specific test, it may be also possible to specify characteristic signals which shall be applied to the device under test, in particular test signals which shall be generated by the test apparatus and provided at an output terminal of the test apparatus.

The related test procedures may be used, for example, for determining appropriate test points of the device under test. Accordingly, the assignment between the interface of the test device and the related measurement points may be performed based on the respective test procedure.

In a possible embodiment, the assignment of the at least on measurement point of the device under test to the interface of the identified test device is dynamically adapted based on the determined test procedure.

In a possible embodiment, the method comprises a step of displaying the generated dynamic representation of the test configuration. For this purpose, the operation assistance apparatus may comprise a display for displaying the dynamic representation.

In a possible embodiment, the method comprises a step of zooming a predetermined area of the generated representation of the test configuration.

The zoom operation may enlarge a specific, predetermined segment of the representation. In particular, the specific segment may be enlarged by a predetermined zoom factor. The specific area which shall be zoomed may be specified, for example by control keys or any other operating element. For example, a mouse may be provided in order to move a cursor over a visual representation, and an area around the mouse pointer may be zoomed. However, any other scheme for zooming or enlarging a specific segment of the representation may be also possible.

In a possible embodiment, the test device comprises at least one of an oscilloscope, a signal generator or a spectrum analyzer.

Accordingly, test system may be provided and operation assistance apparatus and a test device, wherein the test device comprises at least one of an oscilloscope, a signal generator or a spectrum analyzer.

With the present invention it is therefore now possible to assist a user when establishing a test configuration for testing a device under test. By dynamically adapting a representation of the test scenario, in particular a representation of the relationship between the test device and the device under test, a user is guided through the process of establishing the connections between the test device and the device under test. Thus, failures in the test configuration can be avoided, the test configuration can be established faster, and measurement signals can be easily associated with the correct measurement points of the device under test and the respective signals in this way, the reliability of the test procedure can be improved and the required time for executing the test can be minimized.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments, which are specified in the schematic figures of the drawings, in which.

Figure 1:
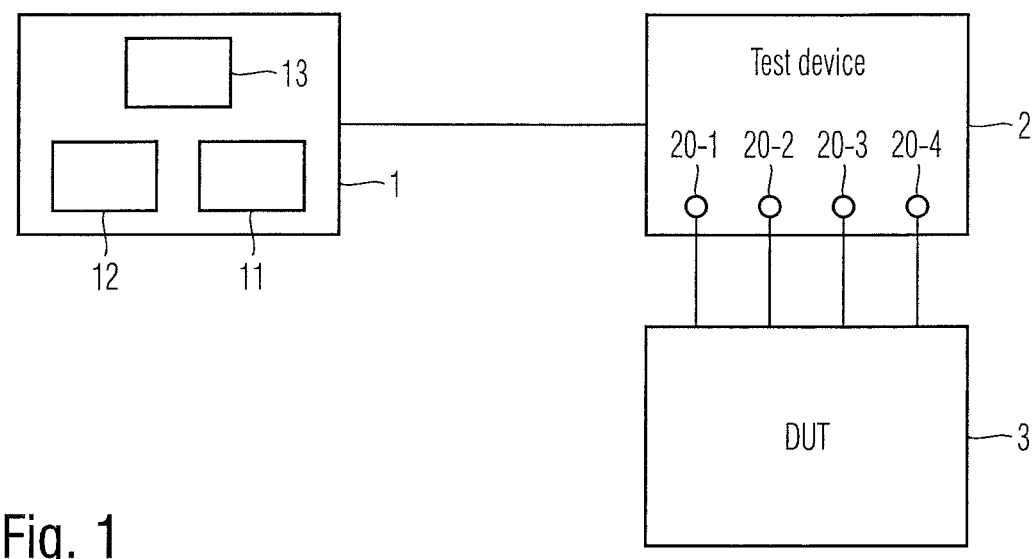
FIG. 1 shows a schematic block diagram of a test system with an operation assistance apparatus according to an embodiment.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown in scale.

In the drawings, same, functionally equivalent and identic operating elements, features and components are provided with same reference signs in each case, unless stated otherwise.

DETAILED DESCRIPTION OF THE DRAWINGS

FIG. 1 shows a schematic illustration of a block diagram of a test system according to an embodiment. The test system may comprise an operation assistance apparatus 1, a test device 2 and a device under test 3. The device under test 3 may be any kind of device which shall be tested in the test scenario. For this purpose, a number of one or more wired connections have to be established between the device under test 3 and the test device 2.

Test device 2 may be any kind of test device for measuring signals from the device under test 3 and/or providing test signals to the device under test 3. For this purpose, test device 2 may comprise a number of one or more test interfaces 20-$i$. The test interfaces 20-$i$ may be, for example, terminals or connectors for connecting the measurement cable. Furthermore, test device 2 may comprise a display for displaying measurement results and/or operational buttons for configuring the test device. The illustrated number of four interfaces 20-$i$ of test device 2 is only for illustrative purposes and does not limit the scope of the invention. Any other number of interfaces 20-*i*, in particular any number of input and/or output interfaces 20-*i* may be also possible.

Operation assistance apparatus 1 may control the procedure for testing the device under test 3 and guide a user through the test procedure. In particular, operation assistance apparatus 1 may provide assistance to a user for establishing the connections between the test device 2 and the device under test 3. For this purpose, a dynamic representation may be provided to a user for assisting the user. The dynamic representation may be, for example, an image of the test configuration illustrating the required connections between the test device 2 and the measurement points of the device under test 3. The dynamic representation may be displayed, for example, on a display 13 of the operation assistance apparatus 1.

Operation assistance apparatus 1 may further comprise an interface 11 and a processor 12. Interface 11 may be, for example, a wired or wireless interface for establishing a connection with test device 2. In this way, operation assistance apparatus 1 may receive data from test device 2. The received data may be analyzed in order to identify test device 2. For example, an identifier may be received by operation assistance apparatus 1 from test device 2. However, any other kind of data exchange may be also possible for identifying test device 2. Furthermore, operation assistance apparatus 1 may receive data from a test device 2 for specifying a current configuration or setting of test device 2. For example, it may be possible to determine a number of available test channels of test device 2. It may be also possible to determine the present setting of the test device 2, for example a sampling rate, a resolution, etc. If the test device 2 may generate test signals, information for specifying the current setting of the generated test signals may be also provided to operation assistance apparatus 1. Any other data for specifying the test device 2 and/or the setting of the test device 2 may be also possible.

Operation assistance apparatus 1 may receive the above-mentioned data for identifying test device 2 and/or the configuration of the test device 2 by interface 11. It is understood, that operation assistance apparatus 1 also may receive further data, in particular further data for characterizing a test device 2 or specifying a desired test operation. Based on the available data relating to test device 2, operation assistance apparatus 1 may guide a user through the procedure for establishing an appropriate test scenario. In particular, operation assistance apparatus 1 may assist a user for establishing connections between the interfaces 20-*i* of the test device 2 and the related measurement points at the device under test 3. For this purpose, operation assistance apparatus 1 may dynamically generate a representation which is provided to the user. The generated representation may specify the interfaces 20-*i* of the test device to and the related measurement points at the device under test 3.

The generated representation may comprise two sections. A first section may relate to the test device 2. A second section may relate to the connections between the interfaces 20-*i* of the test device 2 and the measurement points at the device under test 3.

For example, the first section may be based on an image of a font plate of the related test device 2. The font plate may represent, for example, the connectors of the interfaces 20-*i* of the test device 2. Furthermore, the font plate may also illustrate buttons, indicators or any other kind of operational elements of the device under test 2. The font plate may also illustrate, for example, a display of test device 2, for example a display illustrating measurement results. It is understood, that the font plate for illustrating the device under test 2 may also comprise any other kind of elements.

The second section of the generated representation may specify the assignment of the measurement interfaces 20-*i* of the test device 2 to related measurement points of device under test 3. For example, the measurement points may be specified by appropriate labels. The labels may relate to signals, for example a supply voltage VCC, a clock signal CLK, a data signal DATA, etc. It is understood, that any other kind of signal may be also specified by an appropriate label. For example, alphanumeric elements may be used for characterizing the respective signals or measurement points. Additionally or alternatively, images or icons may be also used for characterizing the respective measurement points at the device under test 3. The connection between an interface 20-*i* of the device under test 2 and a corresponding measurement point, represented by a label or the like, may be illustrated, for example, by a line or any other appropriate element.

Furthermore, it might be possible to provide a representation of the configuration which may successively change over time. For example, in a first step a first connection may be provided in the representation. When it is detected or confirmed that the first connection between the measurement interface 20-1 and the measurement point of the device under test is established, a further connection may be added to the representation. In this way, the user might be guided to establish multiple connections. In particular, the multiple connections may be established in a specific order.

For generating the representation, information regarding the test device 2 may be taken into account. As already mentioned above, the information may comprise information for identifying the test device 2 and/or determining a configuration or parametrization of the test device 2. Furthermore, information relating to the device under test 3 may be also taken into account for generating the representation.

For identifying the test device 2 and/or the device under test 3, it might be also possible to use a camera 8 not shown). The camera may capture one or more images of the test environment. Based on the captures images, the test device 2 and/or the device under test 3 might be identified.

It may be also possible to determine a specific test procedure. For example, a specific test procedure may be selected out of a number of predetermined test procedures. The predetermined test procedures may be stored, for example, in a memory (not shown) of operation assistance apparatus 1.

Alternatively, the test procedures may be provided by an external device via an appropriate interface of the like.

The generated representation may be provided to a user, for example, by means of a display 13 of the operation assistance apparatus 1. Additionally or alternatively, the representation may be also displayed on a remote display which is connected by a wired or a wireless communication link to the test device 2. A user may navigate through the displayed representation, for example, by operation keys, a mouse pointer or the like. For assisting the user, it may be possible to enlarge specific segments of the representation. For example, an area around a mouse pointer may be automatically zoomed. However, it may be also possible that a desired area is only zoomed upon request, for example, by pressing a specific button or the like.

The representation may be generated once for preparing and establishing the configuration in order to perform a desired test scenario. However, it may be also possible that the configuration of the test scenario may to be changed during a test procedure. For this purpose, the representation may be also adapted accordingly during the test procedure. For example, a connection of an interface 20-*i* of a test device 2 to a measurement point of the device under test 3 may be changed to another measurement point of the devices under test during the test procedure. In such a case, the generated representation may be dynamically adapted accordingly, and the adapted representation may be provided to the user, for instance, on a display 13.

Even though only a single test device 2 is displayed in FIG. 1, the present invention is not limited to only a single test device 2. Furthermore, it may be also possible to consider a number of two or even more test devices 2 which shall establish connections with one or more devices under test 3 in a test scenario. In this case, operation apparatus 1 may generate one or more representations considering all related test devices to and/or devices under test 3.

Figure 2:
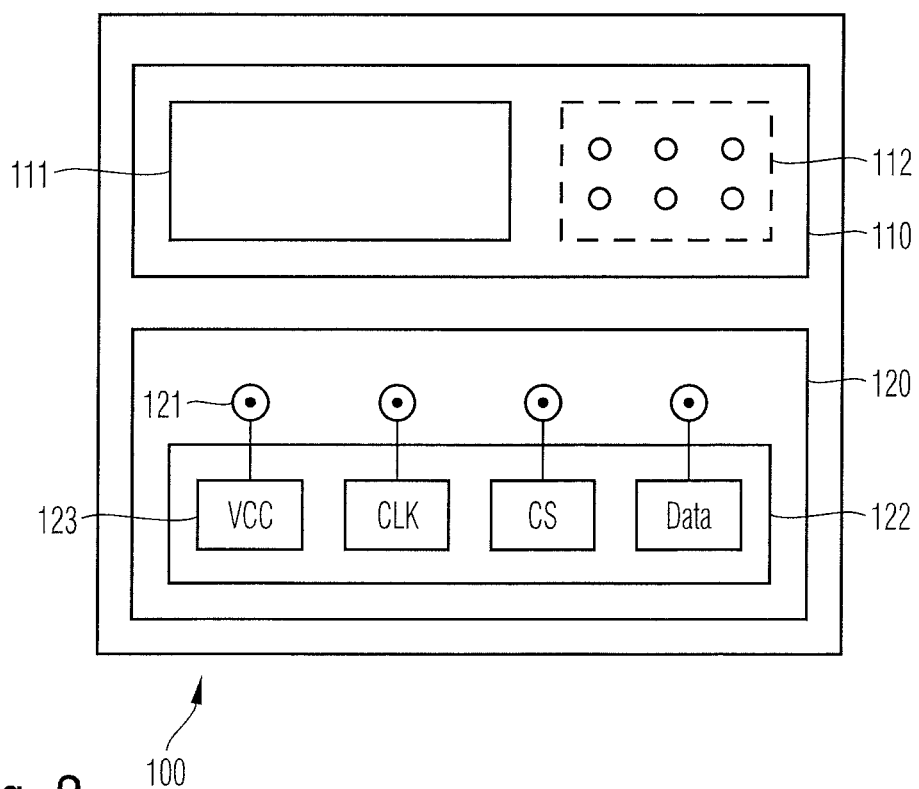
FIG. 2 shows a schematic representation of a test configuration according to an embodiment.

FIG. 2 shows a schematic diagram illustrating a representation 100 of a test configuration, as generated, for example, by operation assistance apparatus 1. The representation 100 may comprise a first section 110 and a second section 120. The first section 110 may relate, for example, to characteristic properties of the test device 2. For example, the first section may comprise a schematic representation of a front plate of the test device 2. The schematic representation of a front plate may comprise, for example, operating elements 112 and/or output elements such as indicators for indicating a state or configuration of the test device 2. Furthermore, the schematic representation of a front plate may also comprise an element 111 for illustrating measurement results. However, it is understood that any other element may be also included in the first section 110 relating to the configuration of the test apparatus 1. In particular, the first section 110 of the representation 100 may be generated based on the characteristic properties of the test device 2.

As can be further seen in FIG. 2, the representation 100 may further comprise a second section 120. The second section 120 may comprise a representation which is generated based on the assignment between the interfaces 121 and the measurement points of the device under test 122. For example, the second section may indicate which interface 121 is connected to a measurement point of the device under test 122. Accordingly, open interfaces can be easily recognized. Furthermore, an assignment of the respective interface 121 to a specific measurement point of the device under test 122 may be indicated. For example, an element 123 may be provided indicating information regarding the respective measurement point of device under test 122. For this purpose, any kind of indication may be used. For example, a simple number may be used for indicating each of the measurement points. However, it may be also possible to use alphanumeric signs, images or other graphical elements for indicating the assigned measurement points of device under test 122. For instance, it may be indicated that a specific terminal 121 may be connected to a measurement point for measuring the supply voltage, a clock rate, a data signal, etc. In this way, user can easily recognize which terminal and corresponding channel of the test apparatus is connected to which measurement point of device under test.

The representation 100 may be displayed, for example, on a display 13 on the operation assistance apparatus 1. Additionally or alternatively, the representation may be also displayed on a remote display which is connected by a wired or a wireless communication link. A user may navigate through the displayed representation, for example, by operation keys, a mouse pointer or the like. For assisting the user, it may be possible to enlarge specific segments of the representation 100. For example, an area around a mouse pointer may be automatically zoomed. However, it may be also possible that a desired area is only zoomed upon request, for example, by pressing a specific button or the like.

The test device 2 may be any kind of test device, for example an oscilloscope, a signal generator, a spectrum analyzer etc. However, it is understood that the present invention is not limited to these examples. Furthermore, any other kind of test apparatus for measuring signals or generating test signals may be possible too.

Figure 3:
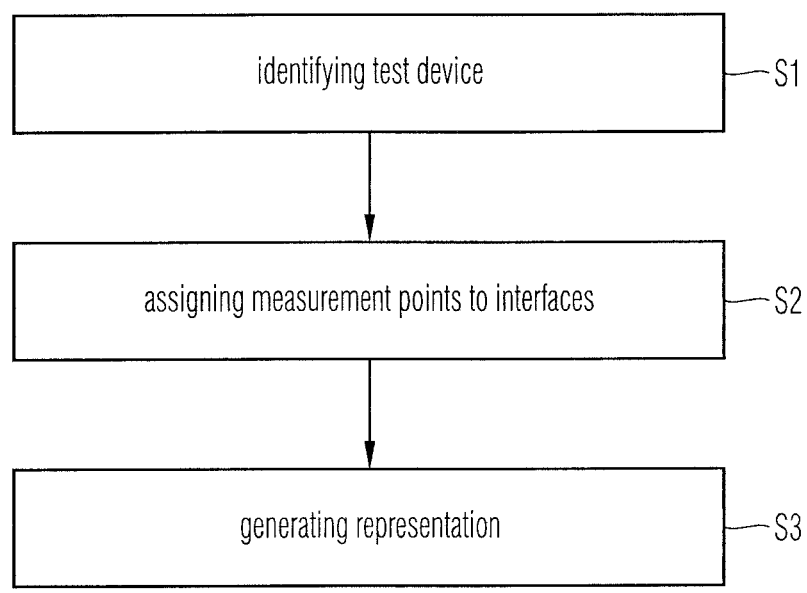
FIG. 3 shows a flow diagram illustrating a method for operating a test system according to an embodiment.

FIG. 3 shows a flow diagram illustrating a method for operating a test system for testing a device under test 3. The method may comprise any step as already described above in connection with operation assistance apparatus 1. Accordingly, the operation assistance apparatus 1 may be configured to perform any operation as described below.

The method comprises a step S1 of identifying a test device 2. The test device 2 is configured to perform at least one test operation for testing the device under test 3. In step S2 at least on measurement point of the device under test 3 is assigned to an interface 20-*i* of the identified test device 2. In step S3 a dynamic representation of a test configuration is generated. The generated dynamic representation is generated based on the identified test device 2 and the assignment of the measurement points and the corresponding interfaces 20-*i* of the test device 2.

The step S1 of identifying the test device 2 may comprises identifying a type of the test device 2 and/or a configuration of the test device 2.

3The generated dynamic representation of the test configuration may comprise a first section and a second section. The first section is dynamically generated based on the identified test device. The second section may be dynamically generated based on the assignment of the measurement points and the corresponding interfaces of the test device 2.

The first section may comprise a dynamically generated representation of a front plate of the identified test device.

The second section may comprise a dynamically generated representation including at least one of a representation of a measurement interface label, measurement setup information, connection information between the interface of the test device and the assigned measurement points of the device under test, information of an expected signal, in particular an expected waveform, or a representation of a button or key of the identified test device.

The method may comprise a step of determining a test procedure for testing the device under test, the determined test procedure specifying a number of related measurement points at the device under test and/or a type of each related measurement point.

The assignment of the at least on measurement point of the device under test to the interface of the identified test device may be dynamically adapted based on the determined test procedure.

The method may comprise a step of displaying the generated dynamic representation of the test configuration on a display.

The method may comprise a step of zooming a predetermined area of the generated representation of the test configuration.

The test device 2 may comprise at least one of an oscilloscope, a signal generator or a spectrum analyzer.

Summarizing, the present invention relates a method and apparatus for setting a test configuration. A test device 2 for testing a device under test 3 is identified, and the measurement interfaces 20-*i* of the test device 2 are assigned to appropriate measurement points of the device under test 3.

The configuration of the test scenario is established by generating a representation of the test device 2 and the connections between the interface of the test device 2 and the related measurement points.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon re-viewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not in-tended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A method for operating a test system for testing a device under test, the method comprising:
    identifying a test device, the test device is configured to perform at least one test operation for testing the device under test;
    assigning at least one measurement point of the device under test to an interface of the identified test device;
    generating a dynamic representation of a test configuration which successively changes over time, wherein the generated dynamic representation is generated based on the identified test device and the assignment of the measurement points and the corresponding interfaces of the test device, wherein identifying the test device comprises automatically identifying the test device based on data received from the test device by a wired or wireless communication link, or by optical recognition of an image of the test device,
    wherein generating the dynamic representation of the test configuration comprises:
    providing a first connection between a measurement interface of the test device and a measurement point of the at least one measurement point of the device under test in the dynamic representation of the test configuration, and
    adding a further connection to the dynamic representation of the test configuration when it is detected or confirmed that the first connection is established, to guide a user to establish multiple connections in a specific order,
    wherein the generated dynamic representation of the test configuration comprises a first section and a second section, the first section is dynamically generated based on the identified test device, and the second section is dynamically generated based on the assignment of the measurement points and the corresponding interfaces of the test device, wherein the second section indicates which interface of the test device is connected to which measurement point of the device under test,
    wherein the first section is only altered when a change in a configuration of the test device is detected, and
    wherein the second section is only altered when a change in the properties in the connection between the test device and the device under test is detected.

2. The test method of claim 1, wherein identifying the test device comprises identifying a type of the test device and/or a configuration of the test device.

3. The test method of claim 1, wherein the first section comprises a dynamically generated representation of a front plate of the identified test device.

4. The test method of claim 1, wherein the second section comprises a dynamically generated representation including at least one of a representation of a measurement interface label, measurement setup information, connection information between the interface of the test device and the assigned measurement points of the device under test, information of an expected signal, or a representation of a button or key of the identified test device.

5. The test method of claim 1, comprising a step of determining a test procedure for testing the device under test, the determined test procedure specifying a number of related measurement points at the device under test and/or a type of each related measurement point.

6. The test method of claim 5, wherein the assignment of the at least one measurement point of the device under test to the interface of the identified test device is dynamically adapted based on the determined test procedure.

7. The test method of claim 1, comprising a step of displaying the generated dynamic representation of the test configuration on a display.

8. The test method of claim 7, comprising a step of zooming a predetermined area of the generated representation of the test configuration.

9. The test method of claim 1, wherein the test device comprises at least one of an oscilloscope, a signal generator or a spectrum analyzer.

10. An operation assistance apparatus comprising:
    an interface for connection the operation assistance apparatus with a test device, the test device being configured to perform at least one test operation for testing a device under test; and a processor for identifying the test device connected to the operation assistance apparatus, assigning at least one measurement point of the device under test to an interface of the identified test device, and generating a dynamic representation of a test configuration which successively changes over time, wherein the generated dynamic representation is generated based on the identified test device and the assignment of the assigned measurement points and the corresponding interfaces of the test device, and wherein the test device is automatically identified based on data received from the test device by a wired or wireless communication link, or by optical recognition of an image of the test device, wherein generating the dynamic representation of the test configuration by the processor comprises:

providing a first connection between a measurement interface of the test device and a measurement point of the at least one measurement point of the device under test in the dynamic representation of the test configuration, and adding a further connection to the dynamic representation of the test configuration when it is detected or confirmed that the first connection is established, to guide a user to establish multiple connections in a specific order, wherein the generated dynamic representation of the test configuration comprises a first section and a second section, wherein the processor is configured to dynamically generate the first section based on the identified test device, and to dynamically generate the second section based on the assignment of the measurement points and the corresponding interfaces of the test device, wherein the second section indicates which interface of the test device is connected to which measurement point of the device under test, wherein the processor is configured to alter the first section only when a change in a configuration of the test device is detected, and wherein the processor is configured to alter the second section only when a change in the properties in the connection between the test device and the device under test is detected.

11. The apparatus of claim 10, wherein the processor is configured to identify a type of the test device and/or a configuration of the test device.

12. The apparatus of claim 10, wherein the processor is configured to generate the first section comprising a dynamically generated representation of a front plate of the identified test device.

13. The apparatus of claim 10, wherein the processor is configured to generate the second section comprising a dynamically generated representation including at least one of a representation of a measurement interface label, measurement setup information, connection information between the interface of the test device and the assigned measurement points of the device under test, information of an expected signal, or a representation of a button or key of the identified test device.

14. The apparatus of claim 10, wherein the processor is configured to determine a test procedure for testing the device under test, the determined test procedure specifying a number of related measurement points at the device under test and/or a type of each related measurement point.

15. The apparatus of claim 14, wherein the processor is configured to dynamically adapt the assignment of the at least on measurement point of the device under test to the interface of the identified test device based on the determined test procedure.

16. The apparatus of claim 10, comprising a display for displaying the generated dynamic representation of the test configuration.

17. The apparatus of claim 16, wherein the display is configured to zoom a predetermined area of the generated representation of the test configuration.

18. A test system comprising the apparatus of claim 10 and a test device comprises at least one of an oscilloscope, a signal generator or a spectrum analyzer.

* * * * *